US006677179B2

(12) United States Patent
Yin et al.

(10) Patent No.: US 6,677,179 B2
(45) Date of Patent: Jan. 13, 2004

(54) METHOD OF APPLYING NO-FLOW UNDERFILL

(75) Inventors: Wusheng Yin, Clinton, NY (US); Ning-Cheng Lee, New Hartford, NY (US)

(73) Assignee: Indium Corporation of America, Utica, NY (US)

( * ) Notice: Subject to any disclaimer, the term of this patent is extended or adjusted under 35 U.S.C. 154(b) by 0 days.

(21) Appl. No.: 10/008,853

(22) Filed: Nov. 16, 2001

(65) Prior Publication Data

US 2003/0096452 A1 May 22, 2003

(51) Int. Cl.$^7$ .................... H01L 21/44; H01L 21/48; H01L 21/50
(52) U.S. Cl. ................ 438/108; 438/115; 438/124; 438/126; 438/127; 228/180.21; 228/180.22
(58) Field of Search .................... 438/108, 124, 438/126, 127, 115; 228/180.21, 180.22

(56) References Cited

U.S. PATENT DOCUMENTS

| | | | | |
|---|---|---|---|---|
| 5,128,746 | A | | 7/1992 | Pennisi et al. .............. 357/72 |
| 6,038,136 | A | | 3/2000 | Weber ...................... 361/783 |
| 6,121,689 | A | * | 9/2000 | Capote et al. .............. 257/773 |
| 6,157,086 | A | | 12/2000 | Weber ...................... 257/788 |
| 6,168,972 | B1 | * | 1/2001 | Wang et al. ................ 438/108 |
| 6,228,678 | B1 | * | 5/2001 | Gilleo et al. ........... 228/180.21 |
| 6,365,435 | B1 | * | 4/2002 | Wang et al. ................ 438/108 |
| 6,367,150 | B1 | * | 4/2002 | Kirsten ..................... 156/182 |

FOREIGN PATENT DOCUMENTS

WO  WO 99/56312  11/1999

OTHER PUBLICATIONS

*A Novel Approach to Incorporate Silica Filler into No–Flow Underfill*, Zhuqing Zhang, et al., School of Materials Scie3nce and Engineering and Packaging Research Center, Georgia Institute of Technology, Atlanta, GA, pp. 1–7.
*No Flow Underfill Materials for Environment Sensitive Flip–Chip Process*, A Dissertation Presented to The Academic Faculty, Zhuqing Zhange, Georgia Institute of Technology, Jun. 2001, pp. 1–125.
*"No–Flow" Underfill Reliability is Here—Finally!*, Michael A Previti, Cookson Semiconductor Packaging Materials, Alpharetta, Ga, Session P–MT1, pp. 1–4.
*The Development of No–Flow Underfill Materials for Flip–Chip Applications*, Advisor Dr. C.P. Wong, Student S.H. Shi, School of Materials Science and Engineering and Packaging Research Center, Georgia Institute of Technology, Atlanta, GA, Feb. 2, 1999.
*Surface Mount Technology, Materials, Processes and Equipment*, Carment Capillo, UNISYS Corporation, Network Computing Group, San Jose, CA, McGraw–Hill Publishing Co.

(List continued on next page.)

Primary Examiner—David A. Zarneke
(74) Attorney, Agent, or Firm—Weingarten, Schurgin, Gagnebin & Lebovici LLP

(57) ABSTRACT

A new method has been developed to provide underfill to chips mounted on substrates. First, an underfill is dispensed on the substrate. Second, the bumps of the chip are dipped in a flux that does not contain filler. Third, the chip that has been dipped in a tacky thermosettable flux is placed on the substrate, and fourth, the chip is soldered to the substrate, and simultaneously the underfill is cured. This process eliminates the interference on solder joints caused by the presence of filler in filled no-flow underfill. In addition, the fluxing property of the flux allows the use of underfills with emphasis on curing and mechanical properties instead of fluxing performance. Accordingly, a mounted device with reliable solder joints and underfill encapsulation is obtained.

13 Claims, 3 Drawing Sheets

OTHER PUBLICATIONS

*Epoxy Flip Chip Flux PK–001*, Indium Corporation of America, Form No. 97727 R0.

*Pb–Free Epoxy Flip Chip Flux PK–002*, Indium Corporation of America, Form No. 97728 R0.

* cited by examiner

METHOD OF APPLYING NO-FLOW UNDERFILL

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

Semiconductor devices (e.g., flip chips) have rapidly been advanced. One important trend of developing semiconductor device is the miniaturization of the products by employing high-density components, HDI, etc. However, the reliability of semiconductor devices is a challenging topic. Due to the large coefficient of thermal expansion mismatch between silicon chips, laminate board (i.e., substrate) and solder interconnects, failure of the semiconductor devices is a major concern. In order to improve the reliability of the semiconductor devices, underfill encapsulants have been developed to reinforce physical, mechanical and electrical properties of the solder joints connecting the chip and substrate, which can dramatically enhance fatigue life. They can also be used in a variety of organic and inorganic substrate materials, resulting in ten to hundred fold improvement in fatigue life as compared to an unencapsulated package. The new technique of underfill encapsulation has been increasingly accepted.

However, currently more than 90% of underfill encapsulants utilize capillary flow underfill, which relies on the use of capillary action to draw the underfill into the gap between the chip and substrate of the assembled package to complete the encapsulation process. There are two main disadvantages to this process: (1) The process of reflowing solder bump and the process of underfilling and curing the encapsulants are separated, which result in lower production efficiency. (2) The limit of capillary force results in the limit of flow distance for underfill materials, which further limits the chip size. As such it becomes a production bottleneck.

Other techniques are also currently in use. "No-flow" underfill (see, for example, U.S. Pat. No. 5,128,746) involves applying to the substrate surface an adhesive which includes a fluxing agent, applying the chip, and soldering it to the substrate. ("No-flow" refers to the fact that the underfill is applied before the component is attached. I.e., it does not have to be flowed under the attached component.) (See FIG. 4, herein, for a schematic of the no-flow process.) The underfill promotes adhesion of the solder, while the thermosetting adhesive cures to mechanically interconnect the chip and the substrate. However, this method is very difficult for applying heavily filled underfills. In addition, there is a significant difference between the high coefficient of thermal expansion (CTE) of unfilled underfill vs. the parts, further contributing to the poor reliability of the system.

A two-layer no-flow underfill system, described in Zhang et al ("A Novel Approach for Incorporating Silica Fillers into No-Flow Underfill", Proceedings of 51st Electronic Components and Technologies Conference, pp. 310–316, (2001)) involves applying a coating with no filler to the base layer, followed by applying a coating that contains filler, and then applying the component. (See FIG. 5, herein, for a schematic of the process.) However, this multiple deposition process is difficult to handle. It results in high production costs and may lead to large differences in CTE.

A molded underfill method, in which the gaps between the chip and substrate are filled using as much as 70–90% filler, and the whole chip is encapsulated, is discussed in U.S. Pat. Nos. 6,038,136 and 6,157,086. Another system wherein underfill is predeposited onto a wafer before the wafer is cut into chips is proposed in WO 99/56312. In this method, it will be difficult to eliminate the air bubbles between the underfill and the substrate during the flip chip mounting stage, which could lead to poor adhesion of the underfill.

All of the existing techniques have one or more of the following negatives:

1. The silica fill interferes with getting a good solder joint, and there is a high solder defect level.
2. Depending on the size of the chip, when capillary flow underfill (i.e., underfill which flows under the chip by relying on capillary action) is added after the soldering is completed, the flow is frequently limited by the capillary forces.
3. The techniques are not high volume, low cost processes.

BRIEF SUMMARY OF THE INVENTION

A new method has been developed to provide underfill to chips mounted on substrates. First, an underfill is dispensed on the substrate. Second, the bumps of the chip are dipped in a flux that does not contain filler. Third, the chip that has been dipped in a tacky thermosettable flux is placed on the substrate, and fourth, the chip is soldered to the substrate, and simultaneously the underfill is cured. This process eliminates the interference on solder joints caused by the presence of filler in filled no-flow underfill. In addition, the fluxing property of the flux allows the use of underfills with emphasis on curing and mechanical properties instead of fluxing performance. Accordingly, a mounted device with reliable solder joints and underfill encapsulation is obtained.

DETAILED DESCRIPTION OF THE INVENTION

Figure 6:
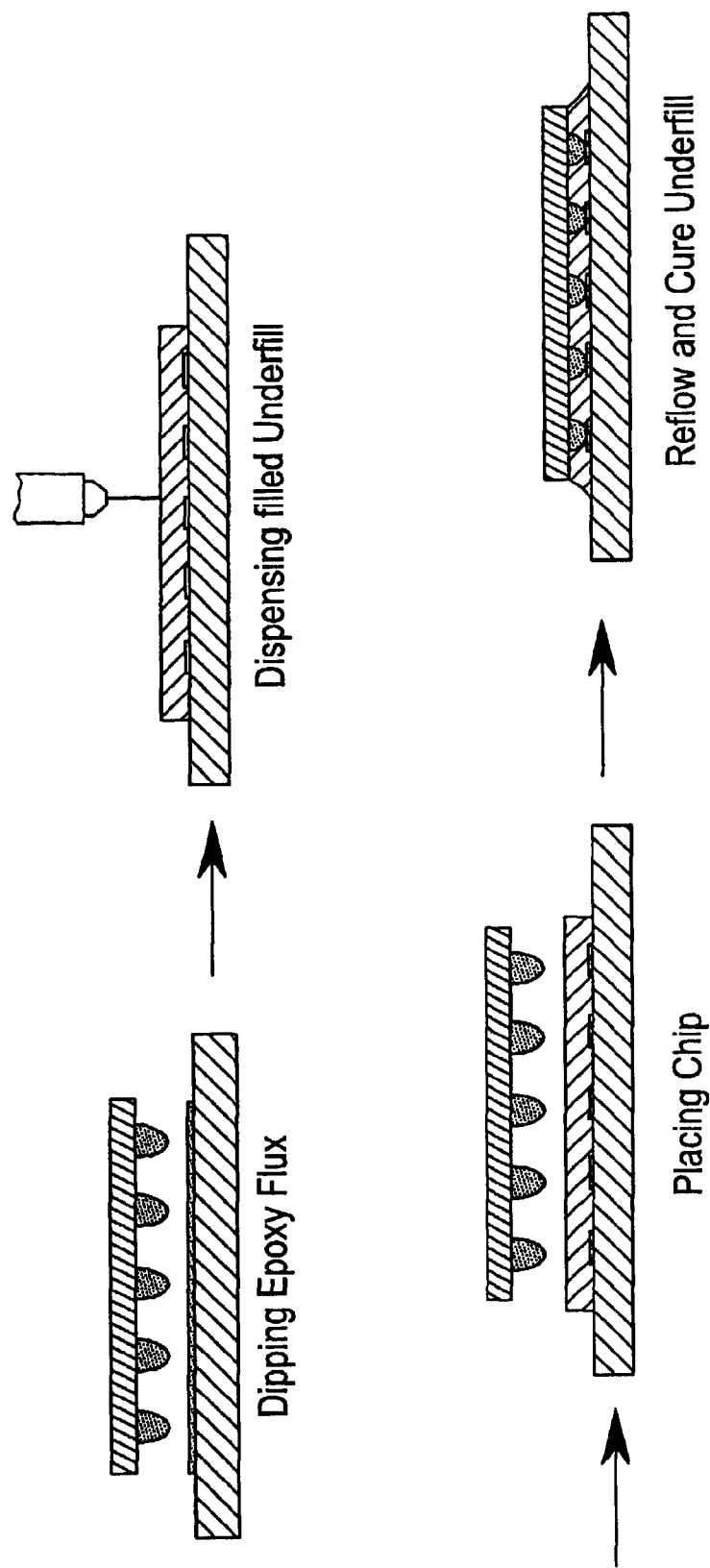
FIG. 6 shows a schematic of the novel method disclosed herein.

A new method has been developed to provide underfill to chips mounted on substrates. (See schematic in FIG. 6.) First, an underfill is dispensed on the substrate. Second, the chip is dipped in a tacky thermosettable flux that does not contain filler. Third, the chip that has been dipped in the flux is placed on the substrate, and fourth, the chip is soldered to the substrate, and the underfill is cured. This process eliminates the negatives from the former processes and is compatible with high-speed production processes.

By tacky thermosettable flux, we mean a flux which is flowable before reflow, provides good flux properties (e.g., removal of oxides, etc.), and, after reflow, is cross-linked to form a thermosetting polymer. Examples of tacky thermosettable flux include epoxy fluxes, polyimide fluxes, polyacrylate fluxes, polyurethane fluxes, and combinations thereof. Other polymers that perform similarly also can be used, either individually or in combination with other such fluxes.

This new process is applicable to all types of components, including chip scale packages, flip chips, and these terms are used interchangeably in this application when describing the process.

a. Types of Underfill

This new method can be used with either filled or unfilled types of underfill. It had been found that use of filled underfill often led to poorly formed joints, since the silica or other fill material in the filled underfill contributed to the poor formation of the joint. Although unfilled underfill might have resulted in improved solder joints than the filled variety, use of the unfilled version still led to frequent failures, since unfilled systems relied on flux mixed with the underfill, and the flux was often incompatible with the underfill. (I.e., they did not mix well nor did they wet the surface well.)

With the new process, however, use of either filled or unfilled underfill leads to well-formed solder joints, combined with good mechanical properties of the underfill. One important factor in getting good solder joints is that the solder wets well both surfaces to be joined. The devices formed using the new process are reliable (i.e., last for a long time).

b. Method of Dispensing Underfill

A typical dispenser machine can be used to dispense the no-flow underfill onto the printed circuit board substrate. One example of such a machine is Asymtek, model C-708 AICE, but any similar machine can be used (such as the Asymtek, model C-702). In addition, particularly for mounting small batches of chips, the underfill can be manually applied by syringe dispersing. Any tool which can dispense a defined amount of underfill onto a substrate can be used.

Any machine which can pick up a component, align it and make a thin film epoxy flux should be usable for dipping the chip in epoxy flux and mounting the chip onto the substrate. One example is a Flip Chip Placement System Model 850, made by Semiconductor Equipment Corp.

c. Compositions of Ingredients

Flux: The viscosity of the flux used should be comparable with or higher than the underfill to be used. The viscosity range of flux depends on the viscosity of underfill. Several examples of flux that can be used are pk-001 and pk-002, which are made by Indium Corporation. Other comparable fluxes can also be used.

Examples of flux/underfill systems and their viscosities are as follows. It should be noted that the viscosity of the flux can range from approximately 1–100,000 times the viscosity of the underfill, preferably 1–100, and more preferably 3–60 times the viscosity.

| Flux/underfill | Viscosity of flux/underfill |
| --- | --- |
| Pk-001 flux/(NFUF-X001) | 30,000 cps/5,000–8,000 cps |
| Pk-002 flux/(NFUF-X002) | 270,000 cps/5,000–8,000 cps |

Solder: A typical solder that can be used is 63Sn37Pb (63% Sn and 37% Pb) or 95.5Sn3.8Ag0.7Cu (i.e., 95.5% Sn, 3.8% Ag and 0.7% Cu, which is Indalloy 241 made by Indium Corporation). However, other solders can be used, so long as flux and underfill are properly chosen.

Underfill: a typical underfill used for flip chip or chip scale package (CSP) assembly can be used, such as NFUF-X001 or NFUF-X002 made by Indium Corporation.

d. Soldering Component to Substrate

The metal area on the substrate is called a pad. All of the pads on the substrate form the footprint for the substrate. The chip is a component with peripheral or area array patterned solder bumps at the bottom side of the chip. During chip mounting the bumps are melted to allow the connection to the substrate to form solder joints. The techniques used for soldering the chip to the substrate can be any of the techniques used in the past or developed in the future. (See, for example, "Surface Mount Technology" by Carmen Capillo, McGraw Hill, 1990, for general information about this subject.)

e. Details of Method of Invention

The following describes the new method:

A flip chip or component was picked up and dipped into the well-defined thickness of tacky thermosettable flux, which was contained in a motorized flux tray. If necessary, the flux could be warmed up by adjusting the temperature of the flux tray to be certain that the flux is at the proper temperature for wetting the solder bumps. In order to produce an accurately bonded part, the solder bumps and substrate pads must first be properly aligned by using flip a chip placement system, such as Flip Chip Placement System Model 850. The alignment must be such that the substrate pads are pointed to the corresponding solder bumps, and the rows of solder bumps and substrate pads are parallel. After alignment, filled no-flow underfill was dispensed onto the substrate, and then the component (flip chip) was placed on the footprint of the substrate. The resulting device was reflowed by passing it through a reflow oven using a defined curing profile.

Variations of the process are possible. For example, the flux can be applied to the bumps either before or after the underfill is applied to the substrate. In general, the curing of the underfill can take place at the same time as the solder joint is formed (for example, if the device is placed in a convection oven). Alternatively, the steps can be performed separately, which would occur if the solder joint was formed in a step separate from the complete curing of the underfill. The reflow/curing process can be conducted under air, inert atmosphere, reducing atmosphere, or hot vapor.

f. Analysis of the Resulting Device

Figure 1:
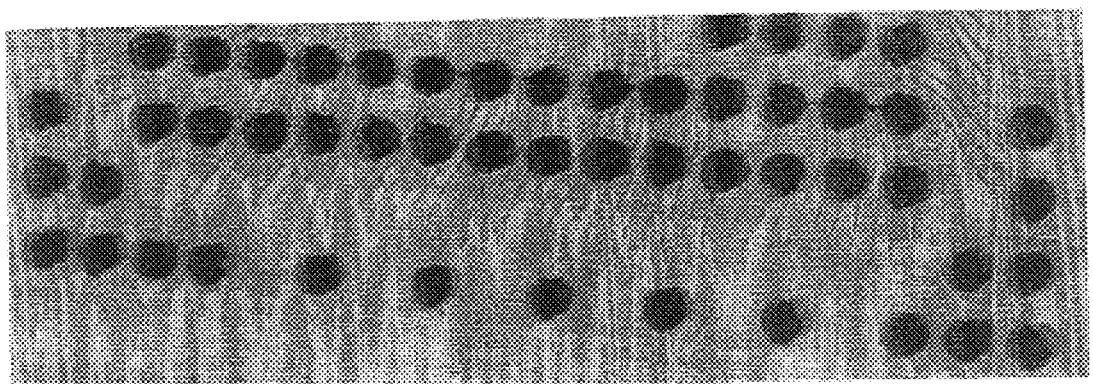
FIG. 1 shows an x-ray image of joints showing good wetting (i.e., good soldering), obtained via the novel procedure, where the x-ray is taken when the substrate is inclined at a 45° angle.
Figure 2:
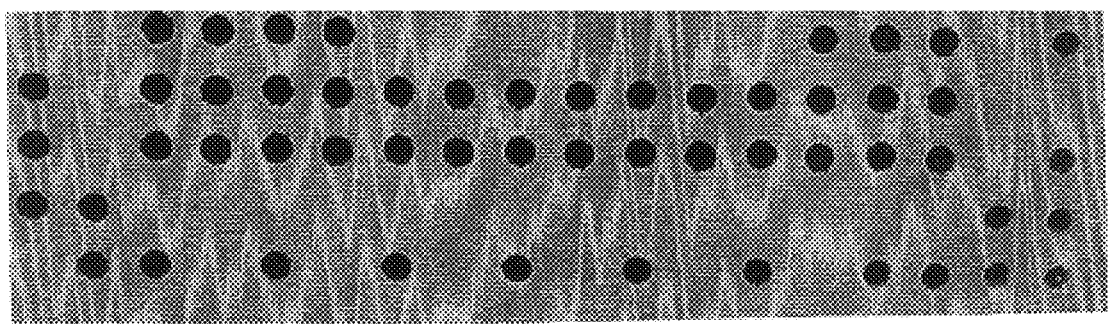
FIG. 2 shows an x-ray image of bumps before soldering takes place, where the x-ray is taken when the substrate is inclined at a 45° angle.
Figure 3:
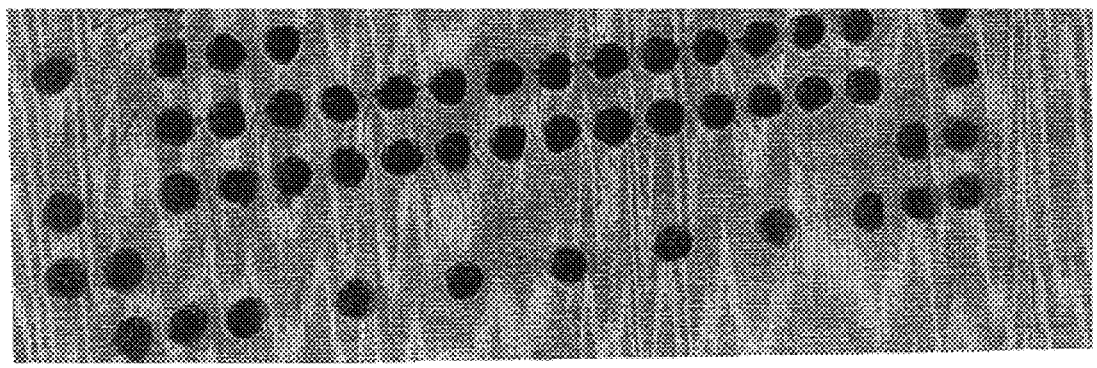
FIG. 3 shows the x-ray image from the former processes, where some joints are acceptable and some are unacceptable.
Figure 4:
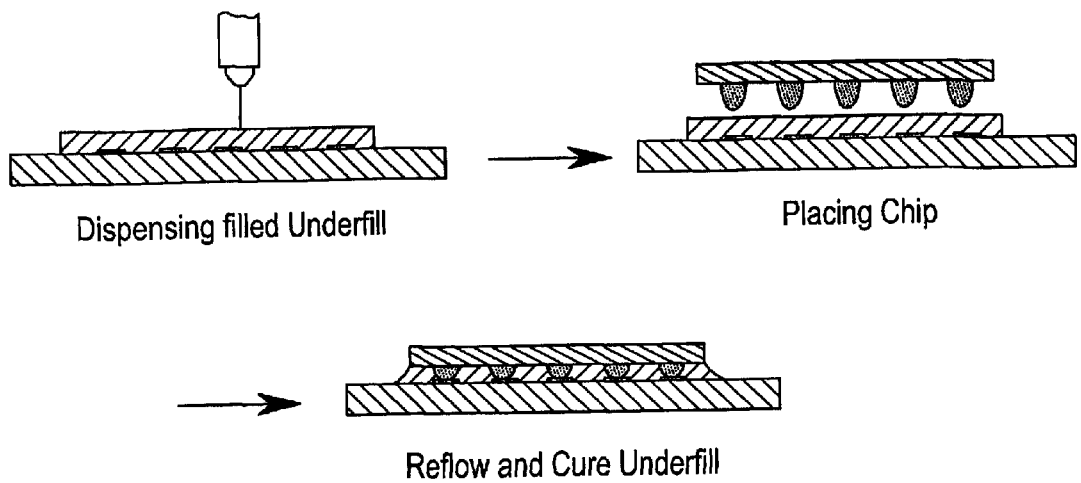
FIG. 4 shows a schematic of a no-flow underfill process.
Figure 5:
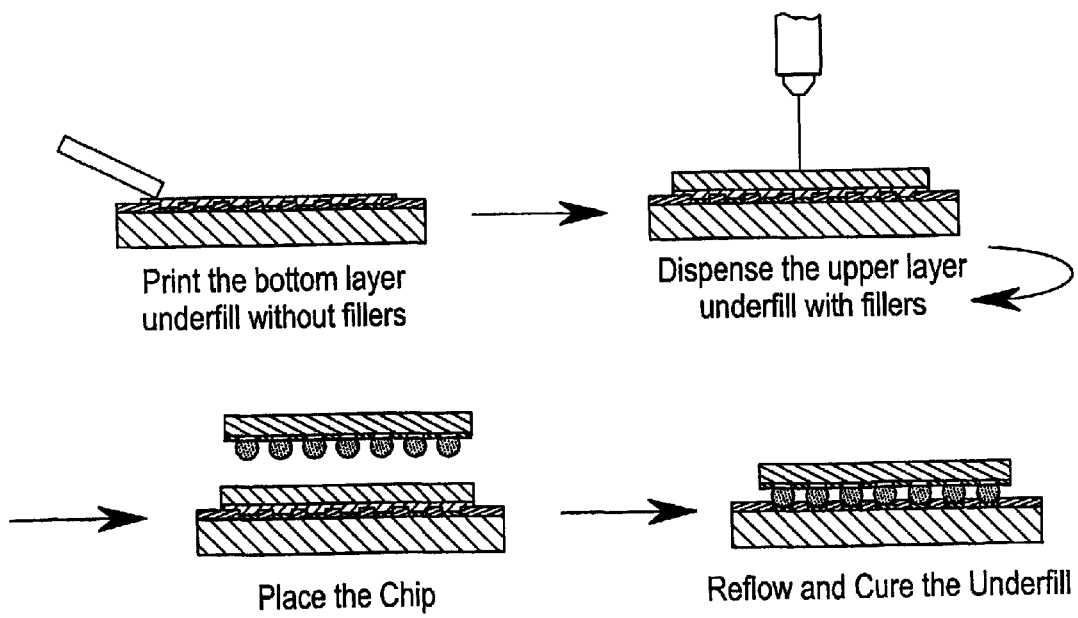
FIG. 5 shows a schematic of a two-layer no-flow underfill process.

X-ray of the resulting joints is useful to determine if the solder joints are acceptable. The results showing good solder joints are shown in FIG. 1. (Note that FIG. 2 shows bumps on the chip before soldering takes place.) As can be seen in these figures, the X-ray should be taken when the substrate is tilted at a 45 degree angle. If the X-ray shows that the resulting X-ray image of a given joint is round, the joint is not good quality. If, however, the image is elliptical, the joint is formed and is good quality. It is important to analyze all of the joints, since, prior to this invention, the results were inconsistent, with some joints being acceptable and others not. (See FIG. 3, where the x-ray of some joints is round (unacceptable joint), while some are elliptical (acceptable joint)).

Other analytical techniques are also possible. For example, a daisy chain can be used to test electrical continuity. In addition, an acoustic microscope can be used to check reflow images.

The following examples are intended to illustrate, not limit, the invention.

EXAMPLE 1

Apparatus for Dispensing Underfill

The Asymtek Model C-702 dispensing machine was set up with suitable condition. The dispensing pressure was generally in the range of 10 to 15 psi, which depends on the viscosity of the no-flow underfill, and a syringe assembled with a # 23 needle containing no-flow underfill was installed onto the this machine. Before the chip is connected to the substrate, a suitable amount of no-flow underfill was dispensed onto the center of the footprint of the substrate.

EXAMPLE 2

Manual Application of the Underfill

A no-flow underfill was transferred into 10 ml syringe, assembled with a #23 needle and a plunger, and degassed. Then a suitable amount of no-flow underfill was manually dispensed onto the center of the footprint of the substrate.

EXAMPLE 3

Soldering the Joints

A component with 63Sn/37Pb solder bumps was picked up using a Flip Chip Placement System Model 850 dispensing machine and dipped into a 2 mil layer of Pk-001 epoxy flux, which was contained in a motorized flux tray. If necessary, epoxy flux could be warmed up by adjusting the temperature of the flux tray to be certain that the flux is at the proper temperature for wetting the solder bumps. In order to produce an accurately bonded part, the solder bumps and substrate pads must first be properly aligned by using a flip chip placement system, such as Flip Chip Placement System Model 850. The alignment must be such that the substrate pads are pointed to the corresponding solder bumps, and the rows of solder bumps and substrate pads are parallel. After alignment, filled no-flow underfill was dispensed onto the substrate using an Asymtel Model C-708 dispenser, and then the component (flip chip) was placed on the footprint of the substrate. The resulting device was reflowed by passing it through a forced air convection oven, for example, BTU VIP 70, using a defined curing profile. For example, a profile ramping up linearly from room temperature to 220° C. at ramp rate of 1° C./sec., then cooling down at a ramp rate at 2° C./sec.

EXAMPLE 4

Testing the Joints

After reflowing, a daisy chain electrical continuity tester (Digital, Multimeter DMM 3200) was used to evaluate the acceptability of the joints. If 100% yield is obtained, the product is further checked to determine whether the resistance value is acceptable or not.

Alternatively, X-ray (e.g., ElectroniX V.J.-2000) or acoustic microscopy (C-SAM® D-6000) can be used to check their reflow images to control the quality of the reflow process.

Those with expertise in this area will recognize that variations from the invention described herein are contemplated to be within the scope of the invention.

What is claimed is:

1. A method for underfilling an electronic chip mounted on a substrate, said method comprising:
    a. dispensing underfill on said substrate
    b. dipping said chip in a tacky thermosettable flux that does not contain filler to create a dipped chip,
    c. placing said dipped chip on said substrate covered with underfill,
    d. soldering said dipped chip to said substrate, and
    e. curing said underfill.
2. The method of claim 1 in which all or some of said steps are performed by a machine.
3. The method of claim 1 in which all or some of said steps are performed manually.
4. The method of claim 1 wherein said underfill is filled.
5. The method of claim 1 wherein said underfill is not filled.
6. The method of claim 1 wherein said flux has a viscosity approximately 1–100,000 times greater than that of said underfill.
7. The method of claim 6 wherein said flux has a viscosity 1–100 times greater than that of said underfill.
8. The method of claim 7 wherein said flux has a viscosity 3–60 times greater than that of said underfill.
9. The method of claim 1 wherein said steps a and b are reversed.
10. The method of claim 1 wherein said steps d and e are conducted simultaneously.
11. A process for connecting an integrated circuit chip to a substrate comprising
    a. coating the connection area of said substrate with an underfill,
    b. dipping said chip into a tacky thermosettable flux that does not contain filler so that the connection bumps of said chip are coated with said flux,
    c. placing said chip having said flux onto said substrate so that the bumps of said chip are in contact with the pads of said substrate,
    d. soldering said chip to said substrate, and
    e. cu ring said underfill.
12. The method of claim 11 wherein said steps a and b are reversed.
13. The method of claim 11 wherein said steps d and e are conducted simultaneously.

* * * * *

UNITED STATES PATENT AND TRADEMARK OFFICE
CERTIFICATE OF CORRECTION

PATENT NO. : 6,677,179 B2
DATED : January 13, 2004
INVENTOR(S) : Wusheng Yin et al.

It is certified that error appears in the above-identified patent and that said Letters Patent is hereby corrected as shown below:

<u>Title page, Item [54] and Column 1, lines 1 and 2,</u>
Title, "METHOD OF APPLYING NO-FLOW UNDERFILL" should read
-- METHOD OF APPLYING FILLED NO-FLOW UNDERFILL --; and <u>Column 6,</u>
Line 47, "cu ring" should read -- curing --.

Signed and Sealed this

Seventh Day of December, 2004

JON W. DUDAS
*Director of the United States Patent and Trademark Office*